(12) United States Patent
Uppal et al.

(10) Patent No.: US 12,048,123 B2
(45) Date of Patent: Jul. 23, 2024

(54) HEAT DISSIPATION DEVICE HAVING SHIELDING/CONTAINMENT EXTENSIONS

(71) Applicant: Intel Corporation, Santa Clara, CA (US)

(72) Inventors: Aastha Uppal, Chandler, AZ (US); Je-Young Chang, Tempe, AZ (US); Ravindranath Mahajan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 933 days.

(21) Appl. No.: 16/750,217

(22) Filed: Jan. 23, 2020

(65) Prior Publication Data

US 2021/0235596 A1 Jul. 29, 2021

(51) Int. Cl.
*H05K 7/20* (2006.01)

(52) U.S. Cl.
CPC .................................. *H05K 7/205* (2013.01)

(58) Field of Classification Search
CPC ....................................................... H05K 7/205
USPC ......................................................... 361/704
See application file for complete search history.

(56) References Cited

U.S. PATENT DOCUMENTS

| | | | | |
|---|---|---|---|---|
| 5,208,731 A | * | 5/1993 | Blomquist | H01L 23/4093 174/16.3 |
| 5,870,285 A | * | 2/1999 | Kosteva | H01L 23/4093 174/16.3 |
| 5,901,039 A | * | 5/1999 | Dehaine | H01L 23/4006 257/E23.084 |
| 5,926,371 A | * | 7/1999 | Dolbear | H05K 1/0204 257/713 |
| 6,043,560 A | * | 3/2000 | Haley | H01L 23/4006 257/730 |
| 6,061,239 A | * | 5/2000 | Blomquist | H01L 23/4093 257/E23.105 |
| 6,071,128 A | * | 6/2000 | Brewington | H01L 23/552 257/E23.114 |
| 6,075,699 A | * | 6/2000 | Rife | H01L 23/4093 174/16.3 |
| 6,093,961 A | * | 7/2000 | McCullough | H01L 23/4093 438/117 |
| 6,205,026 B1 | * | 3/2001 | Wong | H01L 23/552 174/16.3 |
| 6,219,238 B1 | * | 4/2001 | Andros | H01L 23/4093 248/510 |
| 6,293,331 B1 | * | 9/2001 | Wang | H01L 23/4093 257/722 |
| 10,468,331 B2 | * | 11/2019 | Chang | H01L 23/473 |

(Continued)

*Primary Examiner* — Anatoly Vortman
(74) *Attorney, Agent, or Firm* — Essential Patents Group, LLP

(57) ABSTRACT

An integrated circuit assembly may be formed comprising an electronic substrate, at least one integrated circuit device electrically attached to the electronic substrate, a heat dissipation device comprising a main body portion and a resilient portion extending from the main body portion, wherein the resilient portion has a plurality of extensions, a thermal interface material between the at least one integrated circuit device and the heat dissipation device, and a stiffener attached to the electronic substrate, wherein at least a portion of the plurality of extensions of the resilient portion of the heat dissipation device are biased against the stiffener.

18 Claims, 6 Drawing Sheets

(56) References Cited

U.S. PATENT DOCUMENTS

2008/0237840 A1\* 10/2008 Alcoe ................ H01L 23/42
                                                              257/706
2021/0235596 A1\* 7/2021 Uppal ................ H01L 23/562

\* cited by examiner

HEAT DISSIPATION DEVICE HAVING SHIELDING/CONTAINMENT EXTENSIONS

TECHNICAL FIELD

Embodiments of the present description generally relate to the field of integrated circuit package fabrication, and, more specifically, to an integrated circuit assembly including a heat dissipation device having a plurality of extensions for shielding and/or for thermal interface material containment.

BACKGROUND

The integrated circuit industry is continually striving to produce ever faster, smaller, and thinner integrated circuit (IC) devices and packages for use in various electronic products, including, but not limited to, computer servers and portable products, such as portable computers, electronic tablets, cellular phones, digital cameras, and the like.

As these goals are achieved, the IC devices become smaller. Accordingly, the density of power consumption of electronic components within the IC devices has increased, which, in turn, increases the average junction temperature of the IC device. If the temperature of the IC device becomes too high, the integrated circuits may be damaged or destroyed. Thus, heat dissipation devices are used to remove heat from the IC devices in an IC package. In one example, at least one IC device may be mounted to a substrate and the heat dissipation device may be attached to the substrate and extend over the IC device(s) to form the IC package. The distance between the IC device(s) and the heat dissipation device is known as the bond line thickness (BLT).

Generally, a thermal interface material (TIM) is disposed between the IC device(s) and the heat dissipation device to form thermal contact therebetween. The TIM primarily serves two functions: 1) to provide a heat transfer path from the IC device(s) to the heat dissipation device, and 2) to help absorb stresses in the IC package caused by differing thermal expansions between the components therein. With regard to providing a heat transfer path, the thermal efficiency of the TIM is critical to effectively remove heat from the IC device(s). The TIM may include thermal greases, gap pads, polymers, and the like. Although these TIMs have advantages, they also have intrinsic material properties on exposure to thermo-mechanical stresses which can result in "failure modes". These failure modes can include voiding, which can result in delamination from the heat dissipation device and/or the IC device(s); hardening, which can lead to loss of adhesion that can also result in delamination from the heat dissipation device and/or the IC devices; and pump-out, where the TIM physically moves out from between the heat dissipation device and the IC device(s). The thermo-mechanical stresses that cause failure modes result from temperature cycles during the operation of the IC package, manufacturing processes, and shipping. The temperature cycles cause warpage in integrated circuit device(s) within the IC package when it heats and cools during operation. For example, in a standard IC package with one IC device, the heat dissipation device bottoms out at approximately the center of the IC device, due to the IC device's natural convex shape at room temperature. When the IC package is exposed to temperature gradients, the shape of the IC device changes from convex to flat or concave, which causes compression on the TIM at edges or sidewalls of the IC device. When the IC package returns to room temperature, the IC device returns to a convex shape creating an elongation of the TIM at the edge or sidewalls of the IC device. The mechanisms of compression and elongation may cause the previously discussed failure modes.

Furthermore, as IC products and packages become smaller, the IC devices within the products and packages are positioned closer to one another. Moreover, greater power levels are being used by the IC products and packages. The closeness of the IC devices and the increased power levels can give rise to problems with electromagnetic interference. Electromagnetic interference occurs when low-frequency electromagnetic fields are generated by the IC devices, which may interfere with the operation of other integrated circuits within the products or packages. Additionally, when wireless components are incorporated into the IC products and packages, high-frequency electromagnetic radiation is generated, which may also interfere with the operation of other integrated circuits within the products or packages.

One approach to reduce this interference is through the use of electromagnetic shielding structures (known as Faraday cages), such as frames, shields, or cages, which are highly electrically conductive structures that are grounded and enclose or surround a portion of selected IC devices within a product or package. Such structures not only contain electromagnetic fields generated by the IC device(s) that it encloses or surrounds, but also prevents external or ambient electromagnetic fields, such as radio frequency energy, from affecting the functionality of the enclosed IC device(s).

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

Figure 1:
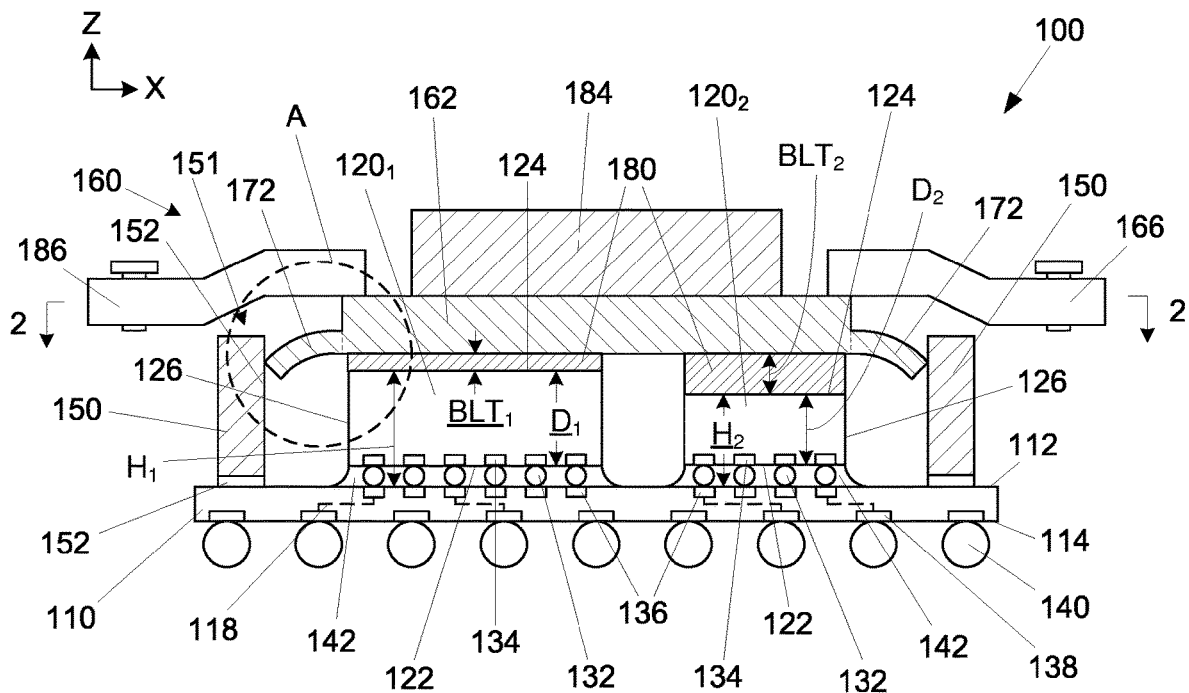
FIGS. 1 and 2 are a side cross-sectional view and a top plan view, respectively, of an integrated circuit assembly, according to one embodiment of the present description.

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The term "package" generally refers to a self-contained carrier of one or more dice, where the dice are attached to the package substrate, and may be encapsulated for protection, with integrated or wire-bonded interconnects between the dice and leads, pins or bumps located on the external portions of the package substrate. The package may contain a single die, or multiple dice, providing a specific function. The package is usually mounted on a printed circuit board for interconnection with other packaged integrated circuits and discrete components, forming a larger circuit.

Here, the term "cored" generally refers to a substrate of an integrated circuit package built upon a board, card or wafer comprising a non-flexible stiff material. Typically, a small printed circuit board is used as a core, upon which integrated circuit device and discrete passive components may be soldered. Typically, the core has vias extending from one side to the other, allowing circuitry on one side of the core to be coupled directly to circuitry on the opposite side of the core. The core may also serve as a platform for building up layers of conductors and dielectric materials.

Here, the term "coreless" generally refers to a substrate of an integrated circuit package having no core. The lack of a core allows for higher-density package architectures, as the through-vias have relatively large dimensions and pitch compared to high-density interconnects.

Here, the term "land side", if used herein, generally refers to the side of the substrate of the integrated circuit package closest to the plane of attachment to a printed circuit board, motherboard, or other package. This is in contrast to the term "die side", which is the side of the substrate of the integrated circuit package to which the die or dice are attached.

Here, the term "dielectric" generally refers to any number of non-electrically conductive materials that make up the structure of a package substrate. For purposes of this disclosure, dielectric material may be incorporated into an integrated circuit package as layers of laminate film or as a resin molded over integrated circuit dice mounted on the substrate.

Here, the term "metallization" generally refers to metal layers formed over and through the dielectric material of the package substrate. The metal layers are generally patterned to form metal structures such as traces and bond pads. The metallization of a package substrate may be confined to a single layer or in multiple layers separated by layers of dielectric.

Here, the term "bond pad" generally refers to metallization structures that terminate integrated traces and vias in integrated circuit packages and dies. The term "solder pad" may be occasionally substituted for "bond pad" and carries the same meaning.

Here, the term "solder bump" generally refers to a solder layer formed on a bond pad. The solder layer typically has a round shape, hence the term "solder bump".

Here, the term "substrate" generally refers to a planar platform comprising dielectric and metallization structures. The substrate mechanically supports and electrically couples one or more IC dies on a single platform, with encapsulation of the one or more IC dies by a moldable dielectric material. The substrate generally comprises solder bumps as bonding interconnects on both sides. One side of the substrate, generally referred to as the "die side", comprises solder bumps for chip or die bonding. The opposite side of the substrate, generally referred to as the "land side", comprises solder bumps for bonding the package to a printed circuit board.

Here, the term "assembly" generally refers to a grouping of parts into a single functional unit. The parts may be separate and are mechanically assembled into a functional unit, where the parts may be removable. In another instance, the parts may be permanently bonded together. In some instances, the parts are integrated together.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, magnetic or fluidic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects to which are being referred and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

For the purpose of the present description, the term "resilient" may be defined to mean a material or structure that when subjected to a stretching (elongation) force and/or a twisting (rotational torsion) force, it will return to substantially its original shape when the force(s) are released. The term "rigid" may be defined to mean a material or structure that is substantially non-resilient, such that it can bear a force, load, and/or stress without deformation.

Embodiments of the present description include an integrated circuit assembly comprising an electronic substrate, at least one integrated circuit device electrically attached to the electronic substrate, a heat dissipation device comprising a main body portion and a resilient portion extending from the main body portion, wherein the resilient portion has a plurality of extensions, a thermal interface material between the at least one integrated circuit device and the heat dissipation device, and a stiffener attached to the electronic substrate, wherein at least a portion of the plurality of extensions of the resilient portion of the heat dissipation device are biased against the stiffener.

FIG. 1 illustrates an integrated circuit assembly 100 having at least one integrated circuit device (illustrated as a first integrated circuit device 120$_1$ and a second integrated circuit device 120$_2$) electrically attached to an electronic substrate 110 in a configuration generally known as a flip-chip or controlled collapse chip connection ("C4") configuration, according to an embodiment of the present description.

The electronic substrate 110 may be any appropriate structure, including, but not limited to, an interposer. The electronic substrate 110 may have a first surface 112 and an opposing second surface 114. The electronic substrate 110 may comprise a plurality of dielectric material layers (not shown), which may include build-up films and/or solder resist layers, and may be composed of an appropriate dielectric material, including, but not limited to, bismaleimide triazine resin, fire retardant grade 4 material, polyimide material, silica filled epoxy material, glass reinforced epoxy material, and the like, as well as low-k and ultra low-k dielectrics (dielectric constants less than about 3.6), including, but not limited to, carbon doped dielectrics, fluorine doped dielectrics, porous dielectrics, organic polymeric dielectrics, and the like.

The electronic substrate 110 may further include conductive routes 118 or "metallization" (shown in dashed lines) extending through the electronic substrate 110. As will be understood to those skilled in the art, the conductive routes 118 may be a combination of conductive traces (not shown) and conductive vias (not shown) extending through the plurality of dielectric material layers (not shown). These conductive traces and conductive vias are well known in the art and are not shown in FIG. 1 for purposes of clarity. The conductive traces and the conductive vias may be made of any appropriate conductive material, including but not limited to, metals, such as copper, silver, nickel, gold, and aluminum, alloys thereof, and the like. As will be understood to those skilled in the art, the electronic substrate 110 may be a cored substrate or a coreless substrate.

The first integrated circuit device 120$_1$ and the second integrated circuit device 120$_2$ may be any appropriate device, including, but not limited to, a microprocessor, a chipset, a graphics device, a wireless device, a memory device, an application specific integrated circuit, combinations thereof, stacks thereof, or the like. As shown, the first integrated circuit device 120$_1$ and the second integrated circuit device 120$_2$ may each have a first surface 122, an opposing second surface 124, and at least one side 126 extending between the first surface 122 and the second surface 124.

As will be understood, when multiple integrated circuit devices are utilized, they may have different thicknesses. For example, as shown in FIG. 1, the first integrated circuit device 120$_1$ and the second integrated circuit device 120$_2$ may have differing thicknesses D$_1$ and D$_2$, respectively, that is measured from the first surface 122 to the second surface 124 of the first integrated circuit device 120$_1$ and the second integrated circuit device 120$_2$, respectively. The differing thicknesses D$_1$ and D$_2$ may result in differing heights H$_1$ and H$_2$ between the first integrated circuit device 120$_1$ and the second integrated circuit device 120$_2$, respectively, that is measured from the first surface 112 of the electronic substrate 110 to the second surface 124 of each of the first integrated circuit device 120$_1$ and the second integrated circuit device 120$_2$, respectively, which may result in differing bond line thickness BLT$_1$ and BLT$_2$, respectively. In an embodiment of the present description, the first integrated circuit device 120$_1$ and the second integrated circuit device 120$_2$ may be electrically attached to the electronic substrate 110 with a plurality of device-to-substrate interconnects 132. In one embodiment of the present description, the device-to-substrate interconnects 132 may extend between bond pads 136 on the first surface 112 of the electronic substrate 110 and bond pads 134 on the first surface 122 of the integrated circuit device 120$_1$ and on the first surface 122 of the second integrated circuit device 120$_2$. The device-to-substrate interconnects 132 may be any appropriate electrically conductive material or structure, including, but not limited to, solder balls, metal bumps or pillars, metal filled epoxies, or a combination thereof. In one embodiment, the device-to-substrate interconnects 132 may be solder balls formed from tin, lead/tin alloys (for example, 63% tin/37% lead solder), and high tin content alloys (e.g. 90% or more tin—such as tin/bismuth, eutectic tin/silver, ternary tin/silver/copper, eutectic tin/copper, and similar alloys). In another embodiment, the device-to-substrate interconnects 132 may be copper bumps or pillars. In a further embodiment, the device-to-substrate interconnects 132 may be metal bumps or pillars coated with a solder material.

The bond pads 134 may be in electrical communication with integrated circuitry (not shown) within their respective integrated circuit devices, i.e. the first integrated circuit device 120$_1$ and the second integrated circuit device 120$_2$. The bond pads 136 on the first surface 112 of the electronic substrate 110 may be in electrical contact with the conductive routes 118. The conductive routes 118 may extend through the electronic substrate 110 and be connected to bond pads 138 on the second surface 114 of the electronic substrate 110. As will be understood to those skilled in the art, the electronic substrate 110 may reroute a fine pitch (center-to-center distance between the bond pads) of the integrated circuit device bond pads 136 to a relatively wider pitch of the bond pads 138 on the second surface 114 of the electronic substrate 110. In one embodiment of the present description, external interconnects 140 may be disposed on the bond pads 138 on the second surface 114 of the electronic substrate 110. The external interconnects 140 may be any appropriate electrically conductive material, including, but not limited to, metal filled epoxies and solders, such as tin, lead/tin alloys (for example, 63% tin/37% lead solder), and high tin content alloys (e.g. 90% or more tin—such as tin/bismuth, eutectic tin/silver, ternary tin/silver/copper, eutectic tin/copper, and similar alloys). The external interconnects 140 may be used to attach the integrated circuit assembly 100 to an external substrate (not shown), such as a motherboard.

An electrically-insulating underfill material 142, such as an epoxy material, may be disposed between the first integrated circuit device $120_1$ and the electronic substrate 110, and between the second integrated circuit device $120_2$ and the electronic substrate 110. The underfill material 142 may be used to overcome the mechanical stress issues that can arise from thermal expansion mismatch between the electronic substrate 110 and the integrated circuit devices $120_1$ and $120_2$. As will be understood to those skilled in the art, the underfill material 142 may be dispensed between the first surfaces 122 of the integrated circuit devices $120_1$, $120_2$, respectively, and the electronic substrate 110 as a viscous liquid and then hardened with a curing process.

Figure 2:
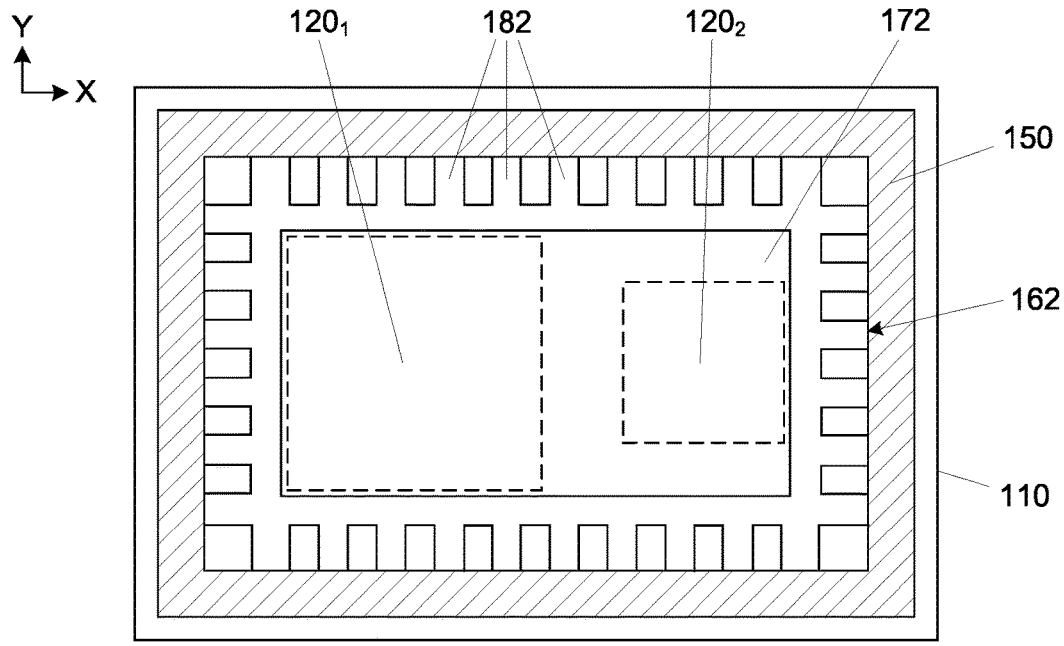

The integrated circuit assembly 100 may further include at least one stiffener 150 attached to the first surface 112 of the electronic substate 110 to improve the structural integrity of the integrated circuit assembly 100 and to also overcome the mechanical stress issues that can arise from thermal expansion mismatch between the electronic substrate 110 and the integrated circuit devices $120_1$ and $120_2$. In one embodiment of the present description, as shown in FIG. 2, the at least one stiffener 150, having a top surface 151, may be a single "picture frame" structure surrounding the first integrated circuit device $120_1$ and the second integrated circuit device $120_2$. The at least one stiffener 150 may be attached or sealed to the first surface 112 of the electronic substrate 110 with an attachment adhesive 152 (see FIG. 1). The at least one stiffener 150 may be fabricated from any appropriate, substantially rigid material, including, but not limited to, metal, plastics, and the like. The attachment adhesive 152 may be any appropriate material, including, but not limited to, silicones (such as polydimethylsiloxane), epoxies, and the like.

As further shown in FIG. 1, integrated circuit assembly 100 may further include a heat dissipation device 160 that may be thermally coupled with the second surface 124 of the first integrated circuit device $120_1$ and the second surface 124 of the second integrated circuit device $120_2$ with a thermal interface material 180. The heat dissipation device 160 may comprise a main body portion 162, e.g. a cold plate portion, and a resilient portion 172 extending from the main body portion 162, wherein the resilient portion 172 includes a plurality of extensions 182.

The heat dissipation device 160 may be made of any appropriate thermally conductive material, including, but not limited to at least one metal material and alloys of more than one metal, or highly doped glass or highly conductive ceramic material, such as aluminum nitride. In an embodiment of the present description, the heat dissipation device 160 may comprise copper, nickel, aluminum, alloys thereof, laminated metals including coated materials (such as nickel coated copper), and the like. In one embodiment, the heat dissipation device 160 and the stiffener 150 may be electrically conductive, such that a Faraday cage is formed, which substantially surrounds the first integrated circuit device $120_1$ and the second integrated circuit device $120_2$.

As shown in FIG. 1, the heat dissipation device 160 may have additional thermal management devices 184 attached to the main body portion 162 to enhance heat removal. Such additional thermal management devices 184 may include, but are not limited to, heat pipes, high surface area dissipation structures with a fan (such as a structure having fins or pillars/columns formed in a thermally conductive structure), liquid cooling devices, and the like, as will be understood to those skilled in the art. Furthermore, the thermal management device 160 may include external attachment devices 186 for attachment to external structures (not shown) to secure the heat dissipation device 160 and may assist in maintaining a desired distance (e.g. bond line thickness $BLT_1$ and $BLT_2$) between the heat dissipation device 160 and second surfaces 124 of the integrated circuit devices $120_1$, $120_2$.

In various embodiments of the present description, the thermal interface material 180 may be any appropriate, thermally conductive material, including, but not limited to, a thermal grease, a thermal gap pads, a polymer, an epoxy filled with high thermal conductivity fillers, such as metal particles or silicon particles, and the like. In one embodiment of the present description, the thermal interface material 180 may be a phase change material. A phase change material is a substance with a high heat of fusion, which, when it melts and solidifies, is capable of storing and releasing large amounts of thermal energy. In an embodiment of the present description, the phase change material may include, but not limited to, nonadecane, decanoic (capric) acid, eicosane, dodecanoic (lauric) acid, docosane, paraffin wax, stearic acid, tetradecanoic (myristic) acid, octadecanol, hexadecanoic (palmitic) acid, and metallic alloys which include one or more of bismuth, lead, tin, cadmium, antimony, indium, thallium, tellurium, selenium, gallium, mercury, and combinations thereof.

Figure 4:
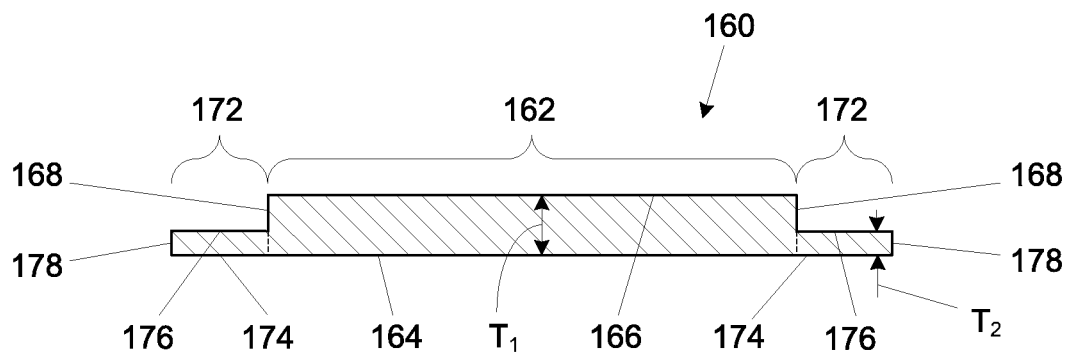
FIGS. 4-7 are cross-sectional views of the heat dissipation devices, according to an embodiment of the present description.
Figure 5:
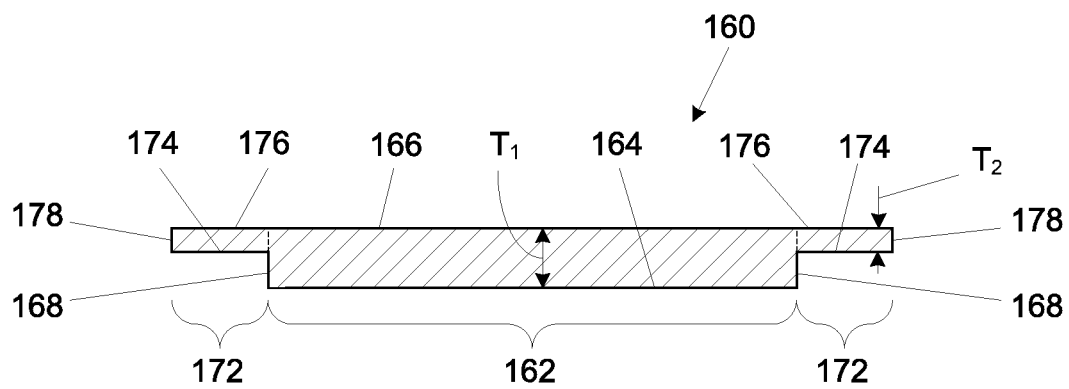
Figure 6:
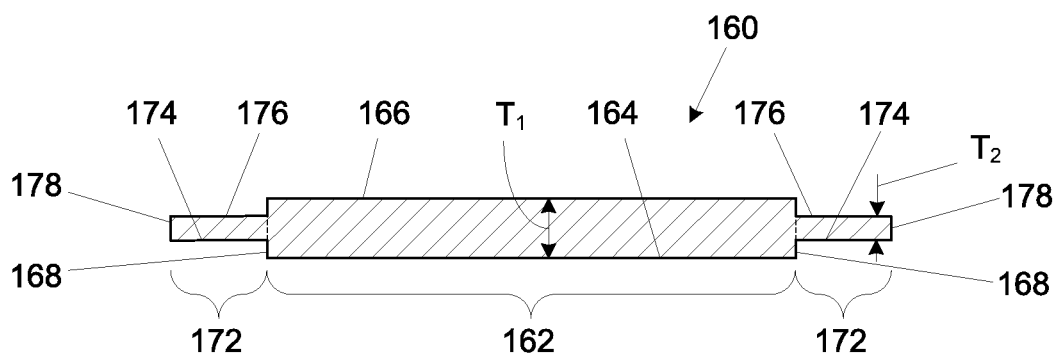
Figure 7:
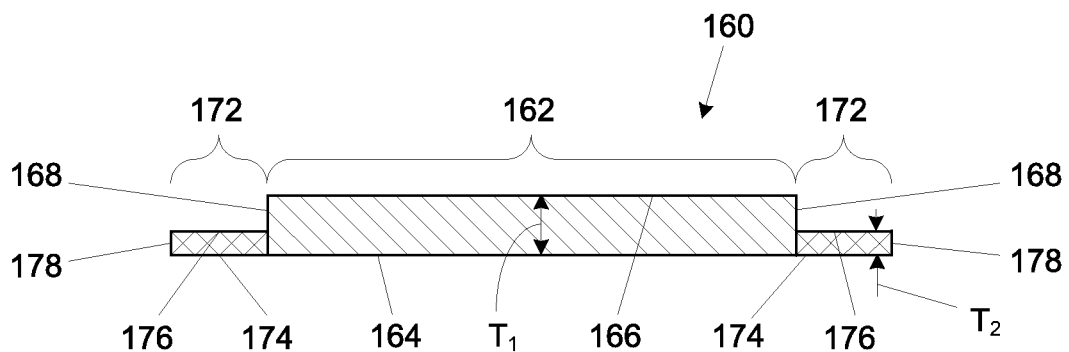

FIGS. 4-9 illustrate embodiments of the heat dissipation device 160 prior to incorporation thereof into the integrated circuit assembly 100. As shown in FIGS. 4, the main body portion 162 of the heat dissipation device 160 may have a first surface 164, an opposing second surface 166, and at least one side 168 extending between the first surface 164 and the second surface 166. The main body portion 162 of the heat dissipation device 160 may further have a thickness $T_1$ from the first surface 164 to the second surface 166. The resilient portion 172 may have a first surface 174, an opposing second surface 176, and at least one side 178 extending between the first surface 174 and the second surface 176. The resilient portion 172 of the heat dissipation device 160 may further have a thickness $T_2$ from the first surface 174 to the second surface 176. In one embodiment of the present description, the thickness $T_2$ of the resilient portion 172 is less than the thickness $T_1$ of the main body portion 162 of the heat dissipation device 160. In another embodiment of the present description, the resilient portion 172 may extend from the at least one side 168 of the main body portion 162 of the heat dissipation device 160. In one embodiment of the present description, the resilient portion 172 may extend substantially perpendicularly from the at least one side 168 of the main body portion 162 of the heat dissipation device 160. In an embodiment of the present description illustrated in FIG. 4, the resilient portion 172 may extend from the at least one side 168 of the main body portion 162 of the heat dissipation device 160 and the first surface 164 of the main body portion 162 may be in substantially the same plane as the first surface 174 of the resilient portion 172 of the heat dissipation device 160. In one embodiment of the present description illustrated in FIG. 5, the resilient portion 172 may extend from the at least one side 168 of the main body portion 162 of the heat dissipation device 160 and the second surface 166 of the main body portion 162 may be in substantially the same plane as the second surface 176 of the resilient portion 172 of the heat dissipation device 160. In another embodiment of the present description illustrated in FIG. 6, the resilient portion 172 may extend from the at least one side 168 of the main body portion 162 of the heat dissipation device 160 and be positioned between the first surface 164 and the second surface 166 of the main body portion 162 of the heat dissipation device 160. The differences in the position of the resilient portion 172 relative to the main body portion 162 of the heat dissipation device 160, as shown in FIGS. 4-6, may affect how the heat dissipation device 160 moves during thermal cycling relative to the first integrated circuit device $120_1$ and the second integrated circuit device $120_2$.

As illustrated in FIGS. 4-6, the main body portion 162 and resilient portion 172 of the heat dissipation device 160 may be a single material throughout, such as when they are formed by a single process step, including but not limited to, stamping, skiving, molding, 3D printing, and the like, which reduces the cost of fabrication. The resiliency of the resilient portion 172 of the heat dissipation device 160 may be adjusted by changing the thickness $T_2$ or the shape of the resilient portion 172. However, embodiments of the present description may also include the heat dissipation device 160 being made of more than one material. For example, at shown in FIG. 7, the main body portion 162 and the resilient portion 172 may be formed separately from different materials, then attached together to form the heat dissipation device 160, such as by compression fitting, adhesive, and the like. Although, forming the heat dissipation device 160 from differing materials is more difficult than forming the heat dissipation device 160 from the same material, it allows for the tuning of the resilience of the plurality of extensions 182 of the resilient portion 172 based on material properties, rather than only in the thickness or shape of the extensions 182 of the resilient portion 172.

Figure 8:
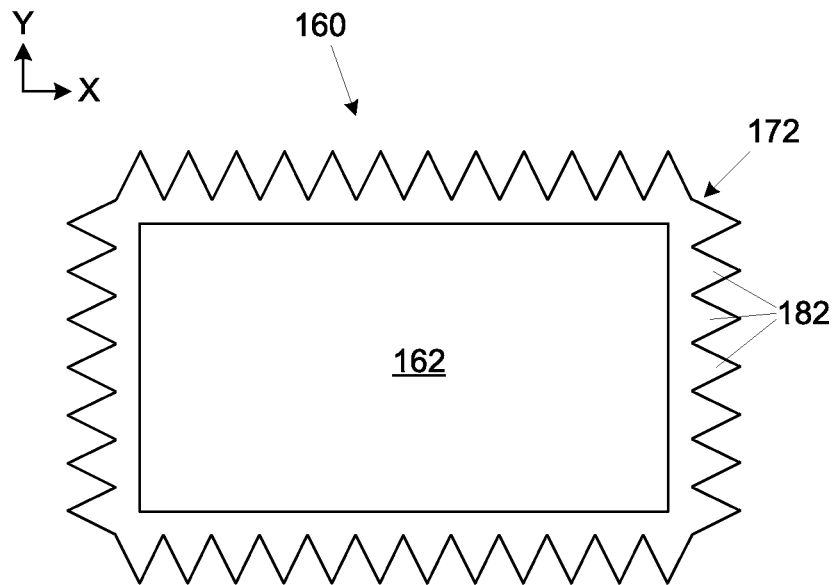
FIGS. 8 and 9 are top plan views of the heat dissipation devices, according to another embodiment of the present description.
Figure 9:
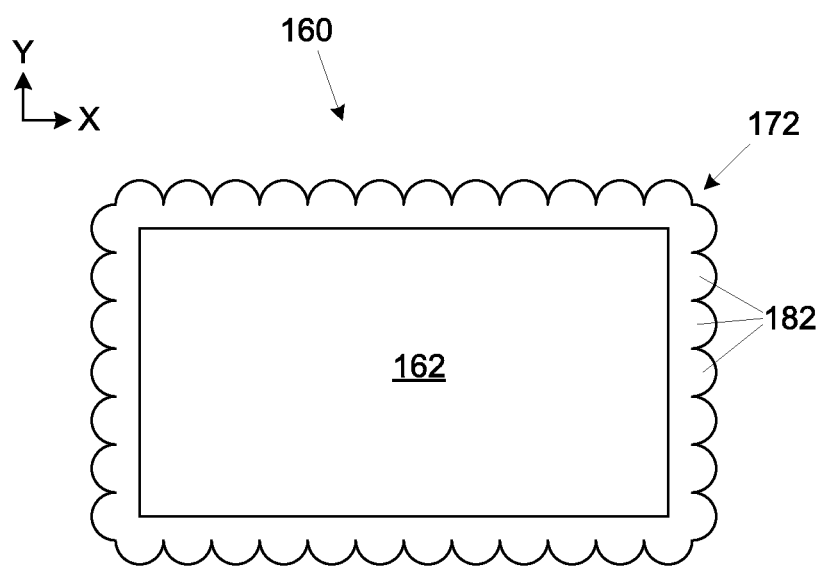

Although the extensions 182 of the resilient portion 172 of the heat dissipation device 160 are illustrated in FIG. 2 as substantially rectilinear, the embodiments of the present description are not so limited and may be any appropriate shape. For example, as shown in FIG. 8, the extensions 182 of the resilient portion 172 of the heat dissipation device 160 may be substantially triangular. In another example, as shown in FIG. 9, the extensions 182 of the resilient portion 172 of the heat dissipation device 160 may be substantially semicircular. The shape and thickness of the extensions 182 of the resilient portion 172 of the heat dissipation device 160 may be determined by the required resilience, the necessary load force and contact area between the extensions 182 and the stiffener 150 (see FIG. 1), the warpage of the integrated circuit assembly 100 during thermal cycling, the distance between the integrated circuit devices $120_1$, $120_2$ and the stiffener 150, and the like.

Figure 3:
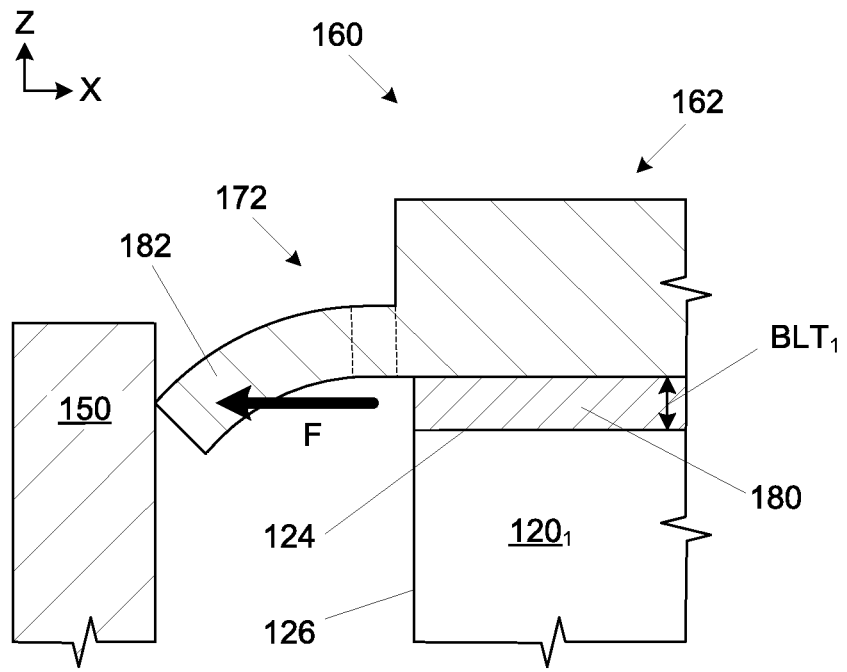
FIG. 3 is a cross-sectional view of the inset A of FIG. 1, according to an embodiment of the present description.

As shown in FIGS. 1-3, the extensions 182 of the resilient portion 172 of the heat dissipation device 160 are biased against the stiffener 150. In other words, the extension 182 may be deformed, flexed, or otherwise bent, and placed to abut inner sidewall 152 of the stiffener 150. As the extensions 182 are resilient (to returned to the shape shown in FIGS. 4-7), a load force (arrow F) is imparted against the stiffener 150, as shown in FIG. 3. This load force F may hold the heat dissipation device 160 in place relative to the stiffener 150. In one embodiment of the present description, the extensions 182 will buckle when the heat dissipation device 160 is incorporated into the integrated circuit assembly 100 and result in conformal bending of the extensions 182. In another embodiment of the present description, the extensions 182 can be pre-bent or pre-buckled in an arc determined during a design phase to create design stresses and, thus, can absorb the warpage of the integrated circuit assembly 100 during thermal cycling.

When the heat dissipation device 160 is used in an integrated circuit assembly 100 according to the embodiments of the present description, issues related to electromagnetic interference/radio frequency interference (EMI/RFI) shielding and issues related to thermal interface material 180 reliability, and issues related to thermomechanical stresses may be addressed, such as minimizing the damage risk to integrated circuit devices $120_1$, $120_2$ due to manufacturing variations in the heat dissipation device 160 and assembly processes, as will be understood to those skilled in the art, may be addressed.

With regard to EMI/RFI shielding, as previously discussed, when the main body portion 162 of the heat dissipation device 160, the resilient portion 172 of the heat dissipation device 160, and the stiffener 150 are electrically conductive, a Faraday cage is formed that substantially surrounds the at least one integrated circuit device $120_1$, $120_2$, which may protect the at least one integrated circuit device $120_1$, $120_2$ from EMI/RFI and/or prevent EMI/RFI from being emitted by the at least one integrated circuit device $120_1$, $120_2$.

With regard to thermal interface material 180 reliability, as the integrated circuit assembly 110 goes through temperature cycling and warpage occurs (as previously discussed), the extensions 182 of the resilient portion 164 of the heat dissipation device 160 allow the heat dissipation device 160 move with the warpage to prevent or reduce the thermal interface material 180 from squeezing or pumping out. Thus, the use of the embodiment of the present description will allow for a greater variety of types of thermal interface materials 180 and provides flexibility with different die heights $D_1$, $D_2$ and different bond line thickness $BLT_1$, $BLT_2$ requirements.

Figure 10:
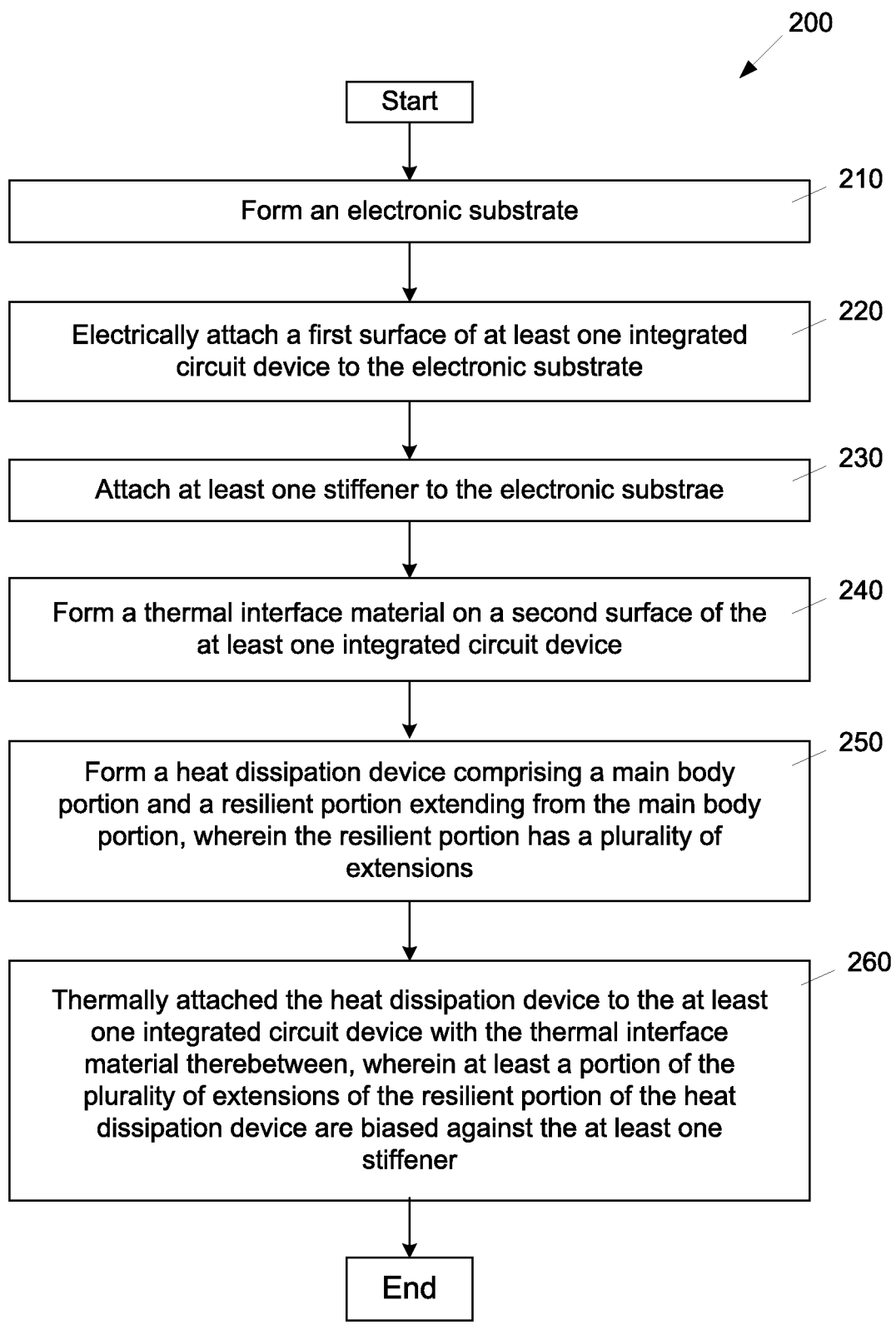
FIG. 10 is a flow chart of a process of fabricating an integrated circuit package, according to an embodiment of the present description.

FIG. 10 is a flow chart of a process 200 of fabricating an integrated circuit assembly according to an embodiment of the present description. As set forth in block 210, an electronic substrate may be formed. A first surface of at least one integrated circuit device may be electrically attached to the electronic substrate, as set forth in block 220. As set forth in block 230, at least one stiffener may be attached to the electronic substrate. A thermal interface material may be formed on a second surface of the at least one integrated circuit device, as set forth in block 240. As set forth in block 250, a heat dissipation device may be formed comprising a main body portion and a resilient portion extending from the main body portion, wherein the resilient portion has a plurality of extensions. The heat dissipation device may be thermally attached to the at least one integrated circuit device with the thermal interface material therebetween, wherein at least a portion of the extensions of the plurality of extensions of the resilient portion of the heat dissipation device are biased against the at least one stiffener, as set forth in block 260.

Figure 11:
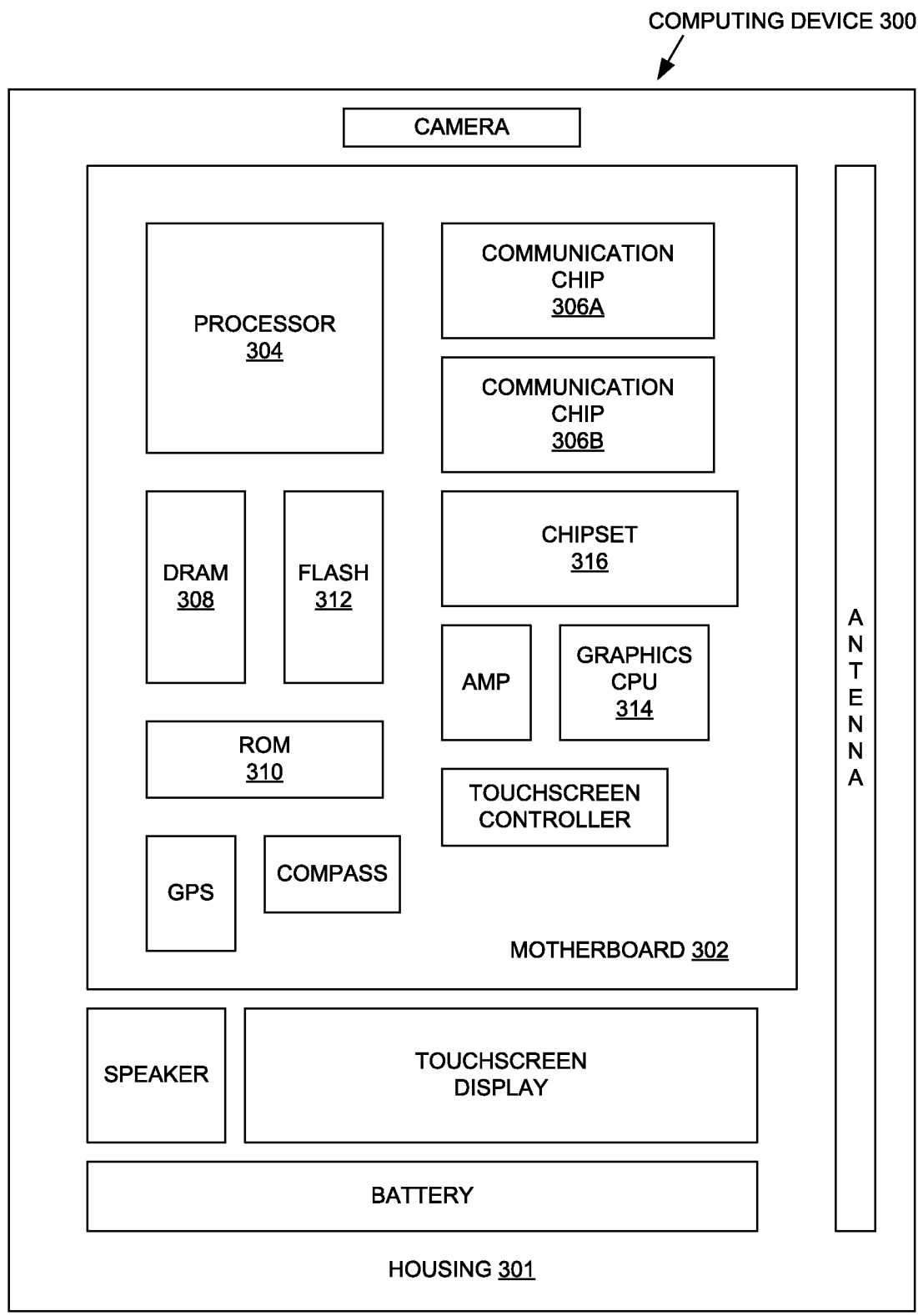
FIG. 11 is an electronic system, according to one embodiment of the present description.

FIG. 11 illustrates an electronic or computing device 300 in accordance with one implementation of the present description. The computing device 300 may include a housing 301 having a board 302 disposed therein. The computing device 300 may include a number of integrated circuit components, including but not limited to a processor 304, at least one communication chip 306A, 306B, volatile memory 308 (e.g., DRAM), non-volatile memory 310 (e.g., ROM), flash memory 312, a graphics processor or CPU 314, a digital signal processor (not shown), a crypto processor (not shown), a chipset 316, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker, a camera, and a mass storage device (not shown) (such as hard disk drive, compact disk (CD), digital versatile disk (DVD), and so forth). Any of the integrated circuit components may be physically and electrically coupled to the board 302. In some implementations, at least one of the integrated circuit components may be a part of the processor 304.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

At least one of the integrated circuit components may include an integrated circuit assembly comprising an electronic substrate, at least one integrated circuit device electrically attached to the electronic substrate, a heat dissipation device comprising a main body portion and a resilient portion extending from the main body portion, wherein the resilient portion has a plurality of extensions, a thermal interface material between the at least one integrated circuit device and the heat dissipation device, and a stiffener attached to the electronic substrate, wherein at least a portion of the plurality of extensions of the resilient portion of the heat dissipation device are biased against the stiffener.

In various implementations, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-11. The subject matter may be applied to other integrated circuit devices and assembly applications, as well as any appropriate electronic application, as will be understood to those skilled in the art.

The following examples pertain to further embodiments and specifics in the examples may be used anywhere in one or more embodiments, wherein Example 1 is an integrated circuit assembly comprising an electronic substrate, at least one integrated circuit device electrically attached to the electronic substrate, a heat dissipation device comprising a main body portion and a resilient portion extending from the main body portion, wherein the resilient portion has a plurality of extensions, a thermal interface material between the at least one integrated circuit device and the heat dissipation device, and a stiffener attached to the electronic substrate, wherein at least a portion of the plurality of extensions of the resilient portion of the heat dissipation device are biased against the stiffener.

In Example 2, the subject matter of Example 1 can optionally include the main body portion of the heat dissipation device, the resilient portion of the heat dissipation device, and the stiffener being electrically conductive.

In Example 3, the subject matter of any of Examples 1 to 2 can optionally include the main body portion of the heat dissipation device and the resilient portion of the heat dissipation device being a single material.

In Example 4, the subject matter of any of Examples 1 to 2 can optionally include the main body portion of the heat dissipation device and the resilient portion of the heat dissipation device being differing materials.

In Example 5, the subject matter of any of Examples 1 to 4 can optionally include the main body portion of the heat dissipation device has a first surface, an opposing second surface, and a thickness defined between the first surface and the second surface; wherein the resilient portion of the heat dissipation device has a first surface, an opposing second surface, and a thickness defined between the first surface and the second surface; and wherein the thickness of the main body portion is greater than the thickness of the resilient portion.

In Example 6, the subject matter of any of Examples 1 to 5 can optionally include the first surface of the main body portion of the heat dissipation device is on the same plane as the first surface of the resilient portion of the heat dissipation device.

In Example 7, the subject matter of any of Examples 1 to 6 can optionally include the resilient portion of the heat dissipation device surrounds the main body portion of the heat dissipation device.

Example 8 is an electronic system, comprising an electronic board and an integrated circuit assembly electrically attached to the electronic board, wherein the integrated circuit assembly comprises comprising an electronic substrate, at least one integrated circuit device electrically attached to the electronic substrate, a heat dissipation device comprising a main body portion and a resilient portion extending from the main body portion, wherein the resilient portion has a plurality of extensions, a thermal interface material between the at least one integrated circuit device and the heat dissipation device, and a stiffener attached to the electronic substrate, wherein at least a portion of the plurality of extensions of the resilient portion of the heat dissipation device are biased against the stiffener.

In Example 9, the subject matter of Example 8 can optionally include the main body portion of the heat dissipation device, the resilient portion of the heat dissipation device, and the stiffener being electrically conductive.

In Example 10, the subject matter of any of Examples 8 to 9 can optionally include the main body portion of the heat dissipation device and the resilient portion of the heat dissipation device being a single material.

In Example 11, the subject matter of any of Examples 8 to 9 can optionally include the main body portion of the heat dissipation device and the resilient portion of the heat dissipation device being differing materials.

In Example 12, the subject matter of any of Examples 8 to 11 can optionally include the main body portion of the heat dissipation device has a first surface, an opposing second surface, and a thickness defined between the first surface and the second surface; wherein the resilient portion of the heat dissipation device has a first surface, an opposing second surface, and a thickness defined between the first surface and the second surface; and wherein the thickness of the main body portion is greater than the thickness of the resilient portion.

In Example 13, the subject matter of any of Examples 8 to 12 can optionally include the first surface of the main body portion of the heat dissipation device is on the same plane as the first surface of the resilient portion of the heat dissipation device.

In Example 14, the subject matter of any of Examples 8 to 13 can optionally include the resilient portion of the heat dissipation device surrounds the main body portion of the heat dissipation device.

Example 15 is a method of fabricating an integrated circuit assembly, comprising forming an electronic substrate, electrically attaching a first surface of at least one integrated circuit device to the electronic substrate, attaching at least one stiffener to the electronic substrate, forming a thermal interface material on a second surface of the at least one integrated circuit device, forming a heat dissipation device comprising a main body portion and a resilient portion extending from the main body portion, wherein the resilient portion has a plurality of extensions, and thermally attaching the heat dissipation device to the at least one integrated circuit device with the thermal interface material therebetween, wherein at least a portion of the plurality of extensions of the resilient portion of the heat dissipation device are biased against the stiffener.

In Example 16, the subject matter of Example 15 can optionally include forming the heat dissipation devices comprises forming the main body portion of the heat dissipation device and the resilient portion of the heat dissipation device from electrically conductive materials, and wherein attaching the stiffener comprises attaching an electrically conductive stiffener.

In Example 17, the subject matter of any of Examples 15 to 16 can optionally include forming the main body portion of the heat dissipation device and the resilient portion of the heat dissipation device from a single material.

In Example 18, the subject matter of any of Examples 15 to 16 can optionally include forming the main body portion of the heat dissipation device and the resilient portion of the heat dissipation device from differing materials.

In Example 19, the subject matter of any of Examples 15 to 18 can optionally include the main body portion of the heat dissipation device has a first surface, an opposing second surface, and a thickness defined between the first surface and the second surface; wherein the resilient portion of the heat dissipation device has a first surface, an opposing second surface, and a thickness defined between the first surface and the second surface; and wherein the thickness of the main body portion is greater than the thickness of the resilient portion.

In Example 20, the subject matter of any of Examples 15 to 19 can optionally include forming the first surface of the main body portion of the heat dissipation device to be on the same plane as the first surface of the resilient portion of the heat dissipation device.

In Example 21, the subject matter of any of Examples 15 to 20 can optionally include forming the resilient portion of the heat dissipation device to surround the main body portion of the heat dissipation device.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. A device, comprising:
    an electronic substrate;
    an integrated circuit (IC) device electrically attached to the electronic substrate, the IC device having a top surface opposite the electronic substrate;
    a stiffener attached to the electronic substrate, the stiffener completely surrounding the IC device and having a top surface that completely surrounds the IC device, the top surface of the stiffener at a higher position than the top surface of the IC device;
    a heat dissipation device within the stiffener, the heat dissipation device comprising a main body portion and a plurality of extensions extending from the main body portion, wherein each of the plurality of extensions is deformed and abutted against an inner sidewall of the stiffener, and wherein the main body portion, the plurality of extensions, and the stiffener are electrically conductive, and the plurality of extensions of the heat dissipation device completely surrounds the main body portion of the heat dissipation device to form a Faraday cage that completely surrounds the IC device; and
    a thermal interface material between the IC device and the heat dissipation device.

2. The device of claim 1, wherein the main body portion of the heat dissipation device and the plurality of extensions of the heat dissipation device are a single material.

3. The device of claim 1, wherein the main body portion of the heat dissipation device and the plurality of extensions of the heat dissipation device are differing materials.

4. The device of claim 1, wherein the main body portion of the heat dissipation device has a first surface, an opposing second surface, and a thickness defined between the first surface and the second surface; wherein the plurality of extensions of the heat dissipation device each have a first surface, an opposing second surface, and a thickness defined between the first surface and the second surface; and wherein the thickness of the main body portion is greater than the thickness of each of the plurality of extensions.

5. The device of claim 4, wherein the first surface of the main body portion of the heat dissipation device is on a same plane as the first surface of each of the plurality of extensions of the heat dissipation device.

6. The device of claim 1, comprising:
    a housing;
    a motherboard disposed within the housing;

an IC assembly electrically attached to the motherboard, wherein the IC assembly comprises the electronic substrate, the IC device, the stiffener, and the thermal interface material.

7. A device, comprising:
an electronic substrate;
an integrated circuit (IC) device electrically attached to the electronic substrate, the IC device having a top surface opposite the electronic substrate;
a stiffener attached to the electronic substrate and completely surrounding the IC device and having a top surface that completely surrounds the IC device, the top surface of the stiffener at a higher position than the top surface of the IC device;
a heat dissipation device within the stiffener, the heat dissipation device comprising a single material throughout the heat dissipation device, the heat dissipation device comprising a main body portion and a plurality of extensions extending from the main body portion, wherein each of the plurality of extensions is flexed and abutting an inner sidewall of the stiffener; and
a thermal interface material between the IC device and the heat dissipation device.

8. The device of claim 7, wherein the heat dissipation device and the stiffener are electrically conductive.

9. The device of claim 8, wherein the heat dissipation device and the stiffener form an electromagnetic interference/radio frequency interference shield around the IC device.

10. The device of claim 7, wherein a thickness of the plurality of extensions is less than a thickness of the main body portion, and wherein a surface of each of the plurality of extensions is co-planar with a top surface or a bottom surface of the main body portion.

11. The device of claim 7, wherein a thickness of each of the plurality of extensions is less than a thickness of the main body portion, and wherein each of the plurality of extensions is located between a top surface and a bottom surface of the main body portion.

12. The device of claim 7, comprising:
a housing;
a motherboard disposed within the housing;
an IC assembly electrically attached to the motherboard, wherein the IC assembly comprises the electronic substrate, the IC device, the stiffener, and the thermal interface material.

13. A device, comprising:
an electronic substrate;
an integrated circuit (IC) device electrically attached to the electronic substrate, the IC device having a top surface opposite the electronic substrate;
a stiffener attached to the electronic substrate, the stiffener completely surrounding the IC device and having a top surface that completely surrounds the IC device, the top surface of the stiffener at a higher position than the top surface of the IC device;
a heat dissipation device within the stiffener, the heat dissipation device comprising a main body portion and a plurality of extensions extending from the main body portion, wherein a thickness of each of the plurality of extensions is less than a thickness of the main body portion, and wherein each of the plurality of extensions is deformed and abutted against an inner sidewall of the stiffener; and
a thermal interface material between the IC device and the heat dissipation device.

14. The device of claim 13, wherein the main body portion of the heat dissipation device, the plurality of extensions of the heat dissipation device, and the stiffener are electrically conductive.

15. The device of claim 14, wherein the heat dissipation device and the stiffener form an electromagnetic interference/radio frequency interference shield around the IC device.

16. The device of claim 13, wherein the main body portion of the heat dissipation device and the plurality of extensions of the heat dissipation device are a single material.

17. The device of claim 13, wherein the main body portion of the heat dissipation device and the plurality of extensions of the heat dissipation device are differing materials.

18. The device of claim 13, comprising:
a housing;
a motherboard disposed within the housing;
an IC assembly electrically attached to the motherboard, wherein the IC assembly comprises the electronic substrate, the IC device, the stiffener, and the thermal interface material.

* * * * *